United States Patent
Yamada

(10) Patent No.: US 11,791,156 B2
(45) Date of Patent: Oct. 17, 2023

(54) METHOD FOR MANUFACTURING SEMICONDUCTOR DEVICE HAVING GALLIUM-BASED COMPOUND SEMICONDUCTOR LAYER

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventor: Tetsuya Yamada, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

(*) Notice: Subject to any disclaimer, the term of this patent is extended or adjusted under 35 U.S.C. 154(b) by 46 days.

(21) Appl. No.: 17/591,202

(22) Filed: Feb. 2, 2022

(65) Prior Publication Data

US 2022/0262634 A1 Aug. 18, 2022

(30) Foreign Application Priority Data

Feb. 12, 2021 (JP) ................. 2021-020634

(51) Int. Cl.
- *H01L 21/02* (2006.01)
- *H01L 23/544* (2006.01)
- *H01L 21/477* (2006.01)
- *H01L 21/265* (2006.01)

(52) U.S. Cl.
CPC ...... *H01L 21/02389* (2013.01); *H01L 21/265* (2013.01); *H01L 21/477* (2013.01); *H01L 23/544* (2013.01); *H01L 2223/54426* (2013.01)

(58) Field of Classification Search
None
See application file for complete search history.

(56) References Cited

U.S. PATENT DOCUMENTS

2018/0102442 A1* 4/2018 Wang ............... H01L 31/02327
2021/0151385 A1 5/2021 Kaji et al.

FOREIGN PATENT DOCUMENTS

JP 2019-102550 A 6/2019

* cited by examiner

*Primary Examiner* — Alexander G Ghyka
(74) *Attorney, Agent, or Firm* — POSZ LAW GROUP, PLC

(57) ABSTRACT

A method for manufacturing a semiconductor device, includes: forming an alignment mark in a non-element region of a gallium-based compound semiconductor layer; and, after the forming of the alignment mark, forming an element structure in an element region of the gallium-based compound semiconductor layer. The forming of the alignment mark further includes: ion-implanting a metal into a part of a surface layer portion of the non-element region of the gallium-based compound semiconductor layer; and annealing the gallium-based compound semiconductor layer.

7 Claims, 4 Drawing Sheets

METHOD FOR MANUFACTURING SEMICONDUCTOR DEVICE HAVING GALLIUM-BASED COMPOUND SEMICONDUCTOR LAYER

CROSS REFERENCE TO RELATED APPLICATION

The present application claims the benefit of priority from Japanese Patent Application No. 2021-020634 filed on Feb. 12, 2021. The entire disclosures of the above application are incorporated herein by reference.

TECHNICAL FIELD

The present disclosure relates to a method for manufacturing a semiconductor device having a gallium-based compound semiconductor layer.

BACKGROUND

As a technique for alignment when forming an element structure in a semiconductor device, it has been known to form a trench for an alignment mark at a part of a surface layer portion in a non-element region of a semiconductor layer.

SUMMARY

The present disclosure describes a technique for forming a new alignment mark, instead of a trench-type alignment mark, in a method for manufacturing a semiconductor device having a gallium-based compound semiconductor layer.

BRIEF DESCRIPTION OF THE DRAWINGS

Objects, features and advantages of the present disclosure will become more apparent from the following detailed description made with reference to the accompanying drawings, in which like parts are designated by like reference numbers and in which.

DETAILED DESCRIPTION

In a semiconductor device, it has been known to use a trench as an alignment mark. Such a trench-type alignment mark needs to maintain its depressed shape through various steps in a process for forming the element structure of the semiconductor device. For example, a process for forming the element structure of the semiconductor device includes a film forming step of forming an epitaxial layer on the surface of the semiconductor layer by using an epitaxial growth technique. The trench-type alignment mark needs to maintain the depressed shape as the alignment mark even when such a film forming step is performed.

According to the diligent study of the present inventor, it was found that, when the material of the semiconductor layer is a gallium-based compound semiconductor, there is a difficulty for the trench-type alignment mark to maintain the depressed shape because of a deformation due to the temperature while the epitaxial layer is formed, or a deformation caused by a difference in film forming speed of the epitaxial layer according to the crystal plane on the side surface of the trench.

The present disclosure provides a technique for forming an alignment mark in a method for manufacturing a semiconductor device having a gallium-based compound semiconductor layer.

According to an aspect of the present disclosure, a method for manufacturing a semiconductor device includes: forming an alignment mark in a non-element region of a gallium-based compound semiconductor layer; and after the forming of the alignment mark, forming an element structure in an element region of the gallium-based compound semiconductor layer. The forming of the alignment mark includes: ion-implanting a metal into a part of a surface layer portion of the non-element region of the gallium-based compound semiconductor layer; and annealing the gallium-based compound semiconductor layer.

According to such a method, the metal ion-implanted into the part of the surface layer portion of the non-element region in the ion-implanting is aggregated and colored by the annealing. Therefore, such a colored metal aggregation can be used for the alignment mark.

Embodiments of the present disclosure will be described hereinafter with reference to the drawings.

Figure 1:
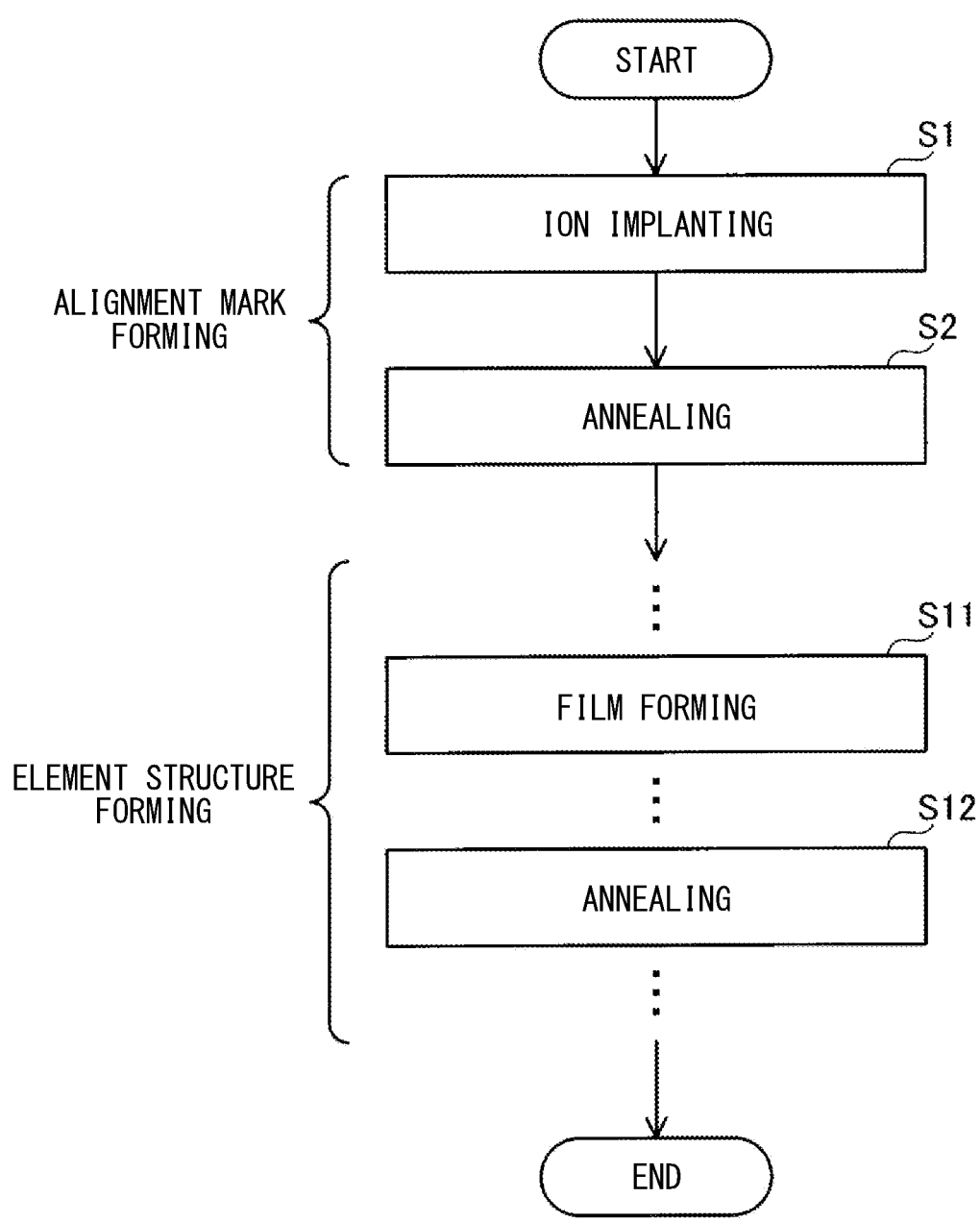
FIG. 1 is a diagram schematically showing a process for manufacturing a semiconductor device according to an embodiment of the present disclosure.

As shown in FIG. 1, a manufacturing flow for manufacturing a semiconductor device according to an embodiment of the present disclosure includes an alignment mark forming process for forming an alignment mark and an element structure forming process for forming an element structure. The alignment mark forming process is performed prior to the element structure forming process. The element structure forming process includes various steps for forming an element structure of a kind, for example, a MOSFET. The element structure referred hereto includes various semiconductor regions such as an n-type drift region, an n-type JFET region, a p-type body region, and an n-type source region. Hereinafter, the alignment mark forming process will be described in detail.

Figure 2:
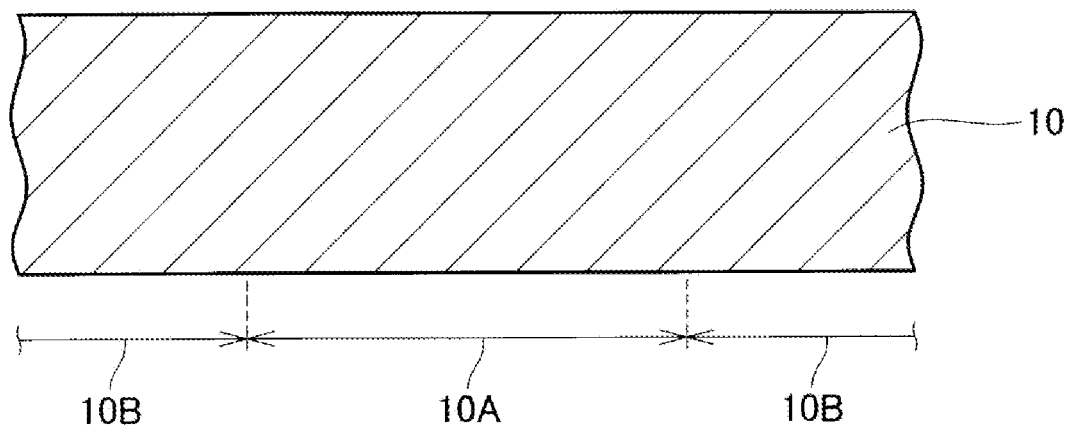
FIG. 2 is a cross-sectional view schematically showing a main part of a gallium-based compound semiconductor layer in a step of forming an alignment mark according to the embodiment.

First, in the alignment mark forming process, as a gallium-based compound semiconductor layer, a gallium nitride based semiconductor layer 10 is prepared, as shown in FIG. 2. The gallium nitride based semiconductor layer 10 is not particularly limited. In this example, the gallium nitride based semiconductor layer 10 is, for example, made of a single crystal of gallium nitride (GaN). In place of the gallium nitride based semiconductor layer 10, a gallium oxide ($Ga_2O_3$) based semiconductor layer may be prepared, as the gallium-based compound semiconductor layer. The gallium nitride based semiconductor layer 10 is sectioned into a non-element region 10A and an element region 10B. The non-element region 10A is a region in which the element structure is not formed. The non-element region 10A is not particularly limited. In this example, the non-element region 10A is a region corresponding to a dicing line. The element region 10B is a region in which the element structure is formed.

Figure 3:
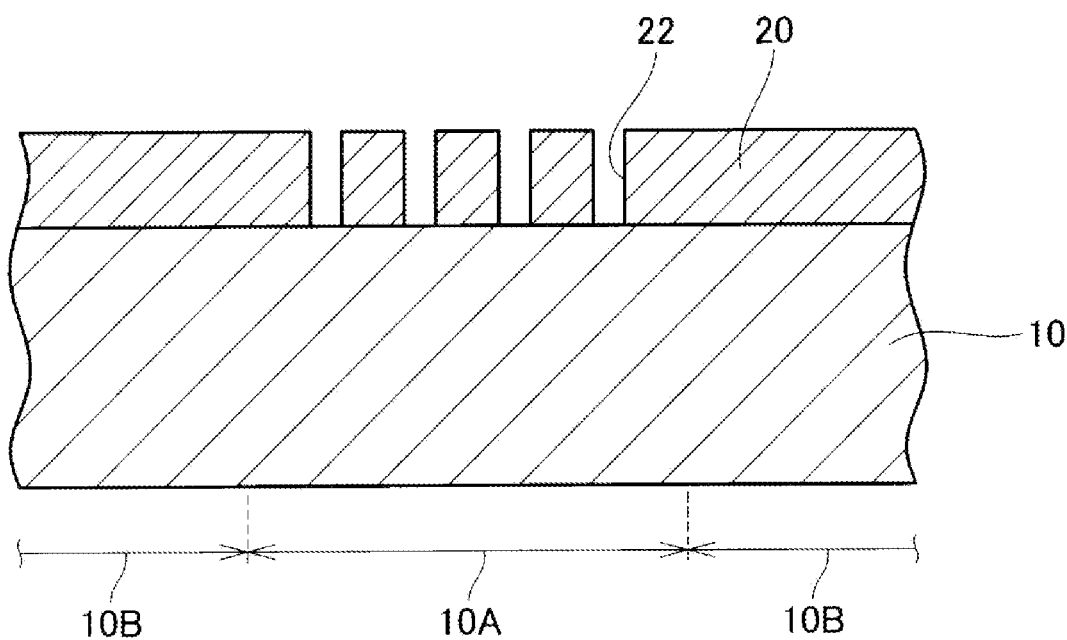
FIG. 3 is a cross-sectional view schematically showing the main part of the gallium-based compound semiconductor layer in a step of forming the alignment mark according to the embodiment.

Next, as shown in FIG. 3, a resist mask 20 is formed on the surface of the gallium nitride based semiconductor layer 10 by using a photolithography technique. The resist mask 20 is formed with a plurality of openings 22 in a range corresponding to the non-element region 10A of the gallium nitride based semiconductor layer 10. The plurality of openings 22 are formed corresponding to the positions where the alignment marks are to be formed.

Figure 4:
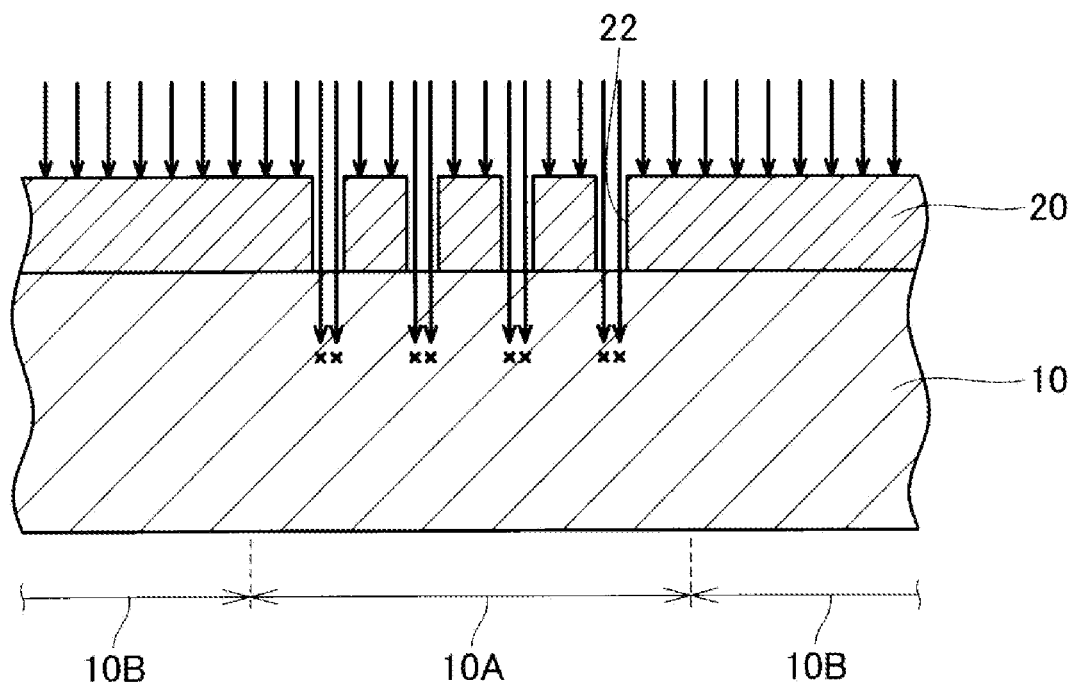
FIG. 4 is a cross-sectional view schematically showing the main part of the gallium-based compound semiconductor layer in a step of forming the alignment mark according to the embodiment.

Next, as shown by arrows in FIG. 4, a metal is ion-implanted into the surface layer portion of the gallium nitride based semiconductor layer 10 exposed through the openings 22 of the resist mask 20 by using an ion implantation technique (ion implanting step S1 in FIG. 1). The metal to be ion-implanted is not particularly limited. In this example, the metal to be ion-implanted is magnesium, for example. In this ion implanting step, a peak position where the concentration of the ion-implanted magnesium has a peak is located inside the gallium nitride based semiconductor layer 10. Specifically, the profile of the ion-implanted magnesium has a peak concentration of $1\times10^{19}$ cm$^{-3}$ or more inside the gallium nitride based semiconductor layer 10 and a peak concentration of $1\times10^{17}$ cm$^{-3}$ or less at the surface of the gallium nitride based semiconductor layer 10. After performing the ion implanting step, the resist mask 20 is removed.

The angle of the ion implantation is not particularly limited. In this example, the ion implantation angle is 0°, for example. In the case where the ion implantation angle is 0°, the ion implantation angle is parallel to the crystal axis of the gallium nitride based semiconductor layer 10. Thus, it is possible to suppress the formation of defects in the surface layer portion of the gallium nitride based semiconductor layer 10. In order to suppress the formation of defects and a metal knocking, a through film of $SiO_2$ or SiN may be formed on the surface of the gallium nitride based semiconductor layer 10, and the ion implantation may be carried out through the through film.

Figure 5:
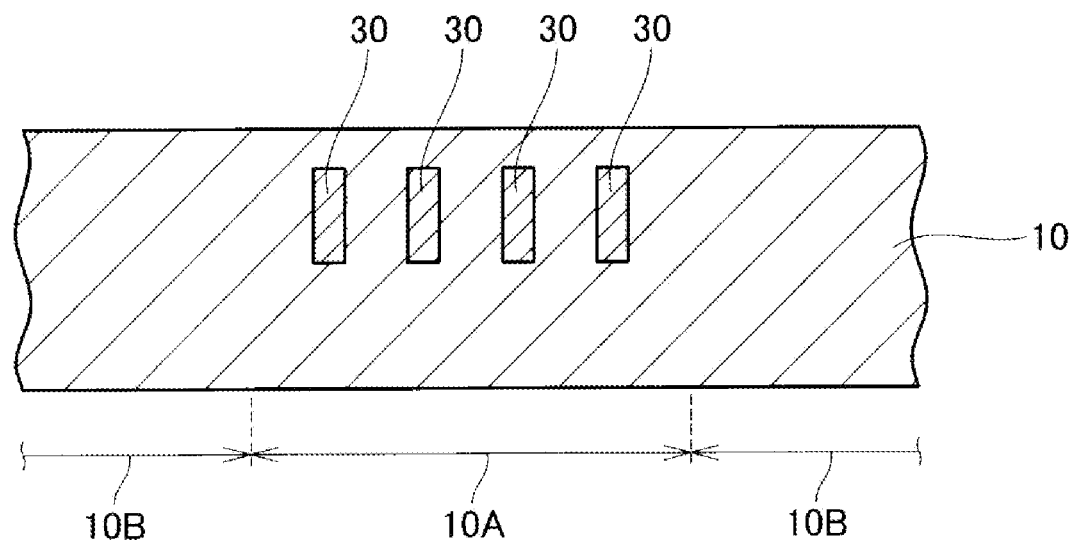
FIG. 5 is a cross-sectional view schematically showing the main part of the gallium-based compound semiconductor layer in a step of forming the alignment mark according to the embodiment.

Next, as shown in FIG. 5, the gallium nitride based semiconductor layer 10 is heated by using an annealing technique (annealing treatment step S2 in FIG. 1). The heating temperature of this annealing treatment step is not particularly limited. In this example, the gallium nitride based semiconductor layer 10 is heated so that the temperature of the gallium nitride based semiconductor layer 10 is 1000 degrees Celsius (° C.) or higher. When such a high-temperature annealing treatment step is performed, the ion-implanted magnesium aggregates and colors, thereby forming the alignment mark 30. In particular, inside of the gallium nitride based semiconductor layer 10 in which the magnesium is ion-implanted at the concentration of $1\times10^{19}$ cm$^{-3}$ or more, the magnesium can be satisfactorily aggregated. On the other hand, at the surface of the gallium nitride based semiconductor layer 10 at which the magnesium is ion-implanted at the concentration of $1\times10^{17}$ cm$^{-3}$ or less, the aggregation of magnesium is suppressed. As a result, it is possible to suppress the formation of defects at the surface of the gallium nitride based semiconductor layer 10.

The position of the alignment mark 30 is recognized by an image analysis using a camera. Since the gallium nitride based semiconductor layer 10 is a material that transmits visible light, even if the alignment mark 30 is formed inside the gallium nitride based semiconductor layer 10, the alignment mark 30 can be recognized from the surface of the gallium nitride based semiconductor layer 10.

As shown in FIG. 1, after the alignment mark forming process, the element structure forming process for forming the element structure in the element region of the gallium nitride based semiconductor layer 10 is performed. In the element structure forming process, the metal aggregation in which the magnesium is aggregated is used for the alignment mark 30. In the element structure forming process, various kinds of steps are carried out. For example, the element structure forming process includes a film forming step S11 of forming an epitaxial layer on the surface of the gallium nitride based semiconductor layer 10, and an annealing treatment step S12 for activating the ion-implanted dopant.

Figure 6:
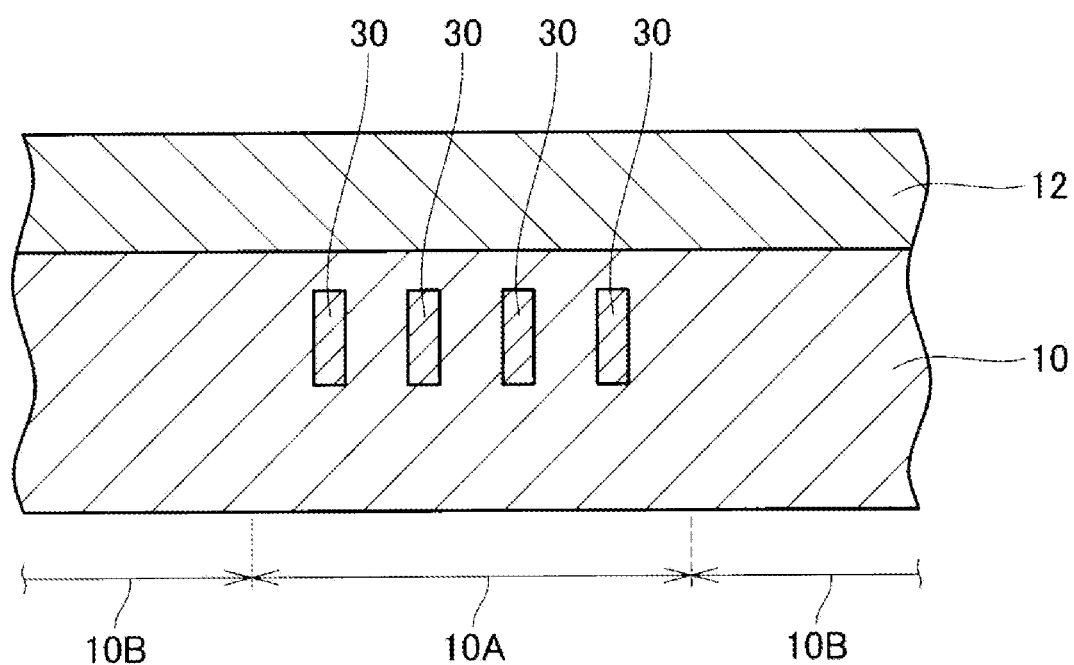
FIG. 6 is a cross-sectional view schematically showing the main part of the gallium-based compound semiconductor layer in a step of forming an element structure in the semiconductor device according to the embodiment.

FIG. 6 schematically shows a cross-sectional view of a main part of the gallium nitride based semiconductor layer 10, after the film forming step S11 of the element structure forming process is performed. An epitaxial layer 12 is formed on the surface of the gallium nitride-based semiconductor layer 10. The epitaxial layer 12 is made of gallium nitride and is transparent. Therefore, even after the epitaxial layer 12 is formed, the alignment mark 30 can be recognized through the surface of the epitaxial layer 12. It should be noted that such a film forming step is performed, after a trench is formed, for example, in a p-type body region, in order to form an n-type JFET region in the trench.

In a case of a trench-type alignment mark, when such an epitaxial layer 12 is formed, the depressed shape of the trench-type alignment mark is likely to be deformed and is thus less likely to be accurately recognized by an image analysis. On the other hand, the alignment mark 30 provided by the metal aggregation does not cause such deterioration in recognition.

Further, as described above, since the concentration of the ion-implanted magnesium is adjusted to $1\times10^{17}$ cm$^{-3}$ or less at the surface of the gallium nitride based semiconductor layer 10, the density of defects in the gallium nitride based semiconductor layer 10 at a position above the alignment mark 30 is low. Therefore, the crystallinity of the epitaxial layer 12 formed above the alignment mark 30 is also favorable, and the deterioration in recognition of the alignment mark 30 is suppressed.

As described above, in the element structure forming process, the annealing treatment step S12 for activating the dopant is also carried out. The heating temperature of this annealing treatment step in the element structure forming process is higher than the heating temperature of the annealing treatment step in the alignment mark forming process. The heating temperature of the annealing treatment step in the element forming process is not particularly limited. In this example, the gallium nitride based semiconductor layer 10 is heated so that the temperature of the gallium nitride based semiconductor layer 10 is 1300° C. or higher. Even if such a high temperature annealing treatment is performed, the metal aggregation of magnesium is maintained and the alignment mark 30 does not disappear. Further, when the annealing treatment at 1300° C. or higher is performed, a loop defect is formed in the metal aggregation of magnesium. Such a loop defect can contribute to the improvement of the recognition of the alignment mark 30.

The features of the techniques disclosed in the present disclosure are summarized hereinafter. It should be noted that the technical elements described hereinafter are independent technical elements and exhibit technical usefulness alone or in various combinations.

In an embodiment, the method for manufacturing a semiconductor device includes: forming an alignment mark 30 in a non-element region 10A of a gallium-based compound semiconductor layer 10; and after the forming of the alignment mark 30, forming an element structure in an element region 10B of the gallium-based compound semiconductor layer 10. The gallium-based compound semiconductor layer 10 is composed of a compound semiconductor containing at least gallium. The gallium-based compound semiconductor layer 10 may be, for example, a gallium nitride based semiconductor layer or a gallium oxide based semiconductor layer. The gallium nitride based semiconductor layer may be, for example, made of gallium nitride (GaN). As another example, the gallium oxide based semiconductor layer may be made of α- or β-type gallium oxide ($Ga_2O_3$). The forming of the alignment mark 30 includes: ion-implanting a metal into a part of a surface layer portion of the non-element region 10A of the gallium-based compound semiconductor layer 10; and annealing the gallium-based compound semiconductor layer 10.

In an embodiment, in the manufacturing method, the gallium-based compound semiconductor layer 10 may be a gallium nitride based semiconductor layer, and the metal may be magnesium.

In a case where the metal to be ion-implanted is magnesium, the magnesium may be ion-implanted into the gallium nitride based semiconductor layer 10 in the ion implanting so that the peak concentration of magnesium is $1\times10^{19}$ $cm^{-3}$ or more. When the magnesium is ion-implanted at such a high concentration, magnesium aggregation can be satisfactorily generated and the alignment mark 30 thus can be formed by the colored metal aggregation.

In an embodiment, in the ion implanting, magnesium may be ion-implanted into the gallium nitride based semiconductor layer 10 so that the peak position where the concentration of ion-implanted magnesium has the peak is located inside the gallium nitride based semiconductor layer 10. By locating the peak position of the concentration inside the gallium nitride based semiconductor layer 10, it is possible to suppress the formation of defects at the surface of the gallium nitride based semiconductor layer 10 in the ion implanting. Further, in the ion implanting, magnesium may be ion-implanted into the gallium nitride based semiconductor layer 10 so that the concentration of the implanted magnesium at the surface of the gallium nitride based semiconductor layer 10 is $1\times10^{17}$ $cm^{-3}$ or less. In the ion implanting, therefore, it is possible to suppress the formation of defects at the surface of the gallium nitride based semiconductor layer 10.

In an embodiment, in the annealing, the gallium nitride based semiconductor layer 10 may be heated so that the temperature of the gallium nitride based semiconductor layer is 1000 degrees Celsius (° C.) or higher. In such a case, magnesium aggregation can be satisfactorily generated and the alignment mark 30 of the colored metal aggregation can be formed.

In an embodiment, in the manufacturing method, the element structure forming may include: forming an epitaxial layer 12 on the surface of the gallium based compound semiconductor layer 10 by using an epitaxial growth technique. Even if such an epitaxial layer 12 is formed, the alignment mark 30 provided by the metal aggregation, which has been formed in the forming of the alignment mark 30, can suppress the deterioration of its recognition.

In an embodiment, in the manufacturing method, the forming of the element structure may include annealing the gallium-based compound semiconductor layer 10. In the annealing of the forming of the element structure, the gallium-based compound semiconductor layer 10 may be heated so that the temperature of the gallium-based compound semiconductor layer 10 is higher than that of the annealing of the forming of the alignment mark 30. In this case, the annealing in the forming of the alignment mark 30 may be referred to as a first annealing, and the annealing in the forming of the element structure may be referred to as a second annealing. Even if such a high-temperature annealing is performed in the forming of the element structure, the deterioration of the recognition of the alignment mark 30 can be suppressed.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:

1. A method for manufacturing a semiconductor device, comprising:
   forming an alignment mark in a non-element region of a gallium-based compound semiconductor layer; and
   after the forming of the alignment mark, forming an element structure in an element region of the gallium-based compound semiconductor layer,
   wherein
   the forming of the alignment mark includes:
      ion-implanting a metal into a part of a surface layer portion of the non-element region of the gallium-based compound semiconductor layer; and
      annealing the gallium-based compound semiconductor layer,
   the gallium-based compound semiconductor layer is a gallium nitride based semiconductor layer, and
   the metal is magnesium.

2. The method according to claim 1, wherein
   in the ion-implanting, the magnesium is ion-implanted into the gallium nitride based semiconductor layer so that a peak concentration of the magnesium is 1×1019 cm−3 or more.

3. The method according to claim 1, wherein in the ion-implanting, the magnesium is ion-implanted into the gallium nitride based semiconductor layer so that a peak position where a concentration of the magnesium has a peak is located inside the gallium nitride based semiconductor layer.

4. The method according to claim 3, wherein in the ion-implanting, the magnesium is ion-implanted into the gallium nitride based semiconductor layer so that the concentration of the magnesium at a surface of the gallium nitride based semiconductor layer is 1×1017 cm−3 or less.

5. The method according to claim 1, wherein in the annealing, the gallium nitride based semiconductor layer is heated so that a temperature of the gallium nitride based semiconductor layer is 1000 degrees Celsius or higher.

6. A method for manufacturing a semiconductor device, comprising:
   forming an alignment mark in a non-element region of a gallium-based compound semiconductor layer; and after the forming of the alignment mark, forming an element structure in an element region of the gallium-based compound semiconductor layer, wherein the forming of the alignment mark includes:
- ion-implanting a metal into a part of a surface layer portion of the non-element region of the gallium-based compound semiconductor layer; and
- annealing the gallium-based compound semiconductor layer, and the forming of the element structure includes forming an epitaxial layer on a surface of the gallium-based compound semiconductor layer by an epitaxial growth technique.

7. The method according to claim 1, wherein the annealing in the forming of the alignment mark is a first annealing, the forming of the element structure includes, as a second annealing, annealing the gallium-based compound semiconductor layer, and in the second annealing, the gallium-based compound semiconductor layer is heated so that the temperature of the gallium-based compound semiconductor layer is higher than that in the first annealing.

* * * * *